(12) United States Patent
Otake et al.

(10) Patent No.: US 7,224,505 B2
(45) Date of Patent: May 29, 2007

(54) MANUFACTURING METHOD OF ELECTRO-OPTICAL APPARATUS SUBSTRATE, MANUFACTURING METHOD OF ELECTRO-OPTICAL APPARATUS, ELECTRO-OPTICAL APPARATUS SUBSTRATE, ELECTRO-OPTICAL APPARATUS, AND ELECTRONIC INSTRUMENT

(75) Inventors: Toshihiro Otake, Okaya (JP); Tomohiko Kojima, Toyoshina-machi (JP); Hideki Kaneko, Shiojiri (JP); Toshinori Uehara, Matsumoto (JP); Tomoyuki Nakano, Toyoshina-machi (JP); Keiji Takizawa, Toyshina-machi (JP)

(73) Assignee: Seiko Epson Corporation (JP)

( * ) Notice: Subject to any disclaimer, the term of this patent is extended or adjusted under 35 U.S.C. 154(b) by 198 days.

(21) Appl. No.: 10/980,750

(22) Filed: Nov. 3, 2004

(65) Prior Publication Data

US 2005/0122567 A1 Jun. 9, 2005

(30) Foreign Application Priority Data

Nov. 4, 2003 (JP) ............................. 2003-374280
Jun. 22, 2004 (JP) ............................. 2004-184090

(51) Int. Cl.
*G02F 1/03* (2006.01)

(52) U.S. Cl. ...................... 359/245; 359/347; 359/315

(58) Field of Classification Search ................ 359/315, 359/247, 253, 245, 238
See application file for complete search history.

(56) References Cited

U.S. PATENT DOCUMENTS

| 2003/0209710 A1* | 11/2003 | Yamazaki et al. ............. 257/66 |
| 2004/0012966 A1* | 1/2004 | Takasaki et al. ............. 362/348 |
| 2006/0001961 A1* | 1/2006 | Gibilini ...................... 359/456 |

FOREIGN PATENT DOCUMENTS

| JP | 2000-171793 | 6/2000 |
| JP | 2000-171794 | 6/2000 |
| JP | 2001-290014 | 10/2001 |
| JP | 2003-075987 | 3/2003 |
| JP | 2003-302740 | 10/2003 |
| JP | 2003-302741 | 10/2003 |
| JP | 2003-320742 | 10/2003 |

* cited by examiner

*Primary Examiner*—Timothy Thompson
*Assistant Examiner*—Jerry Fang
(74) *Attorney, Agent, or Firm*—Harness, Dickey & Pierce, P.L.C.

(57) ABSTRACT

A manufacturing process of an electro-optical apparatus substrate is provided wherein a substrate is coated with a photosensitive resin. A first exposure process is executed with a first reticle to form an uneven portion on the substrate. Subsequently, a second exposure process is executed with a second reticle to remove all the photosensitive resin on portions other than the uneven portion. After the second exposure process, the substrate is developed so as to form an underlying film having an uneven portion.

4 Claims, 14 Drawing Sheets

B—B'

(OBSERVING SIDE)

(BACK FACE SIDE)

(OBSERVING SIDE)

(BACK FACE SIDE)

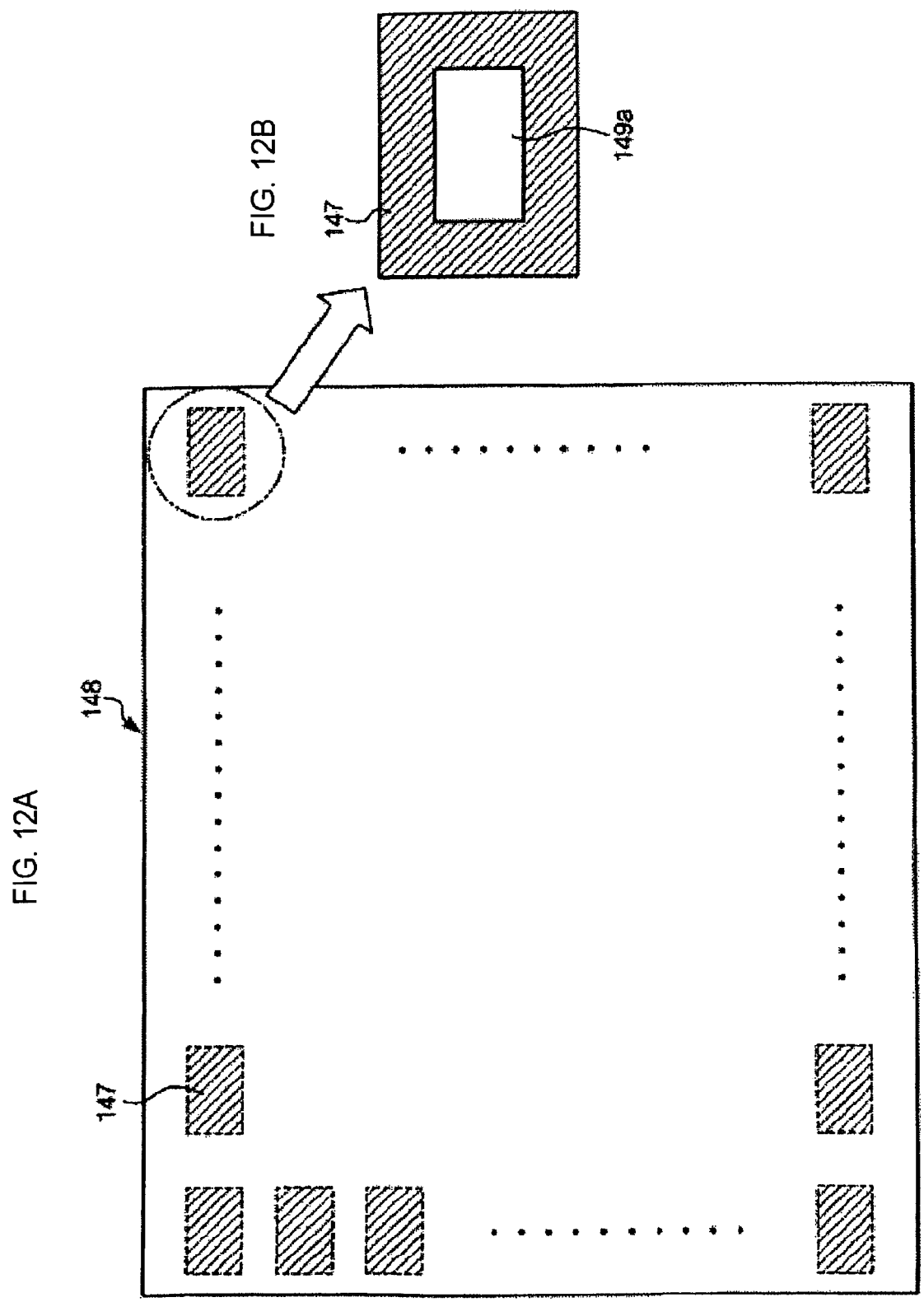

MANUFACTURING METHOD OF ELECTRO-OPTICAL APPARATUS SUBSTRATE, MANUFACTURING METHOD OF ELECTRO-OPTICAL APPARATUS, ELECTRO-OPTICAL APPARATUS SUBSTRATE, ELECTRO-OPTICAL APPARATUS, AND ELECTRONIC INSTRUMENT

RELATED APPLICATIONS

This application claims priority to Japanese Patent Application Nos. 2003-374280 filed Nov. 4, 2003, and 2004-184090 filed Jun. 22, 2004 which are hereby expressly incorporated by reference herein in their entirety.

BACKGROUND

1. Technical Field

The present invention relates to electro-optical apparatuses, and in particular relates to a transflective electro-optical apparatus capable of reflective display by reflecting incident light from an observing side as well as capable of transmissive display by transmitting incident light from a back face.

2. Related Art

A transflective liquid crystal device, which is a kind of electro-optical apparatus, includes a transflective layer that transmits light from a backlight located between a liquid crystal layer and a backlight unit, and also reflects external light. This transflective layer includes at least one opening for transmitting light from the backlight. The transflective layer also includes an uneven reflection surface for diffusing external light so as to prevent an observer from being mirrored on the screen.

A method for making the uneven reflection surface is described in Japanese Unexamined Patent Application Publication No. 2003-75987, for example. In this method, as shown in FIG. 14(a), a substrate 500 is coated with a positive photosensitive resin 510, and the applied photosensitive material is exposed to light using a photo-mask 520. Light-transmission parts 530 randomly arranged in the photo-mask 520 are for making an uneven surface on an underlying film 540a. When a photosensitive resin is developed after being exposed to light with such a photo-mask 520, the underlying film 540a having an uneven surface shown in FIG. 14(c) is made. Then, after the underlying film 540a is post-baked, the positive photosensitive resin is again applied on the as-formed uneven surface and the substrate 500 so as to expose a mounting region around a panel display area to light. When the photosensitive resin is developed after being exposed to light, the underlying film 540b having an uneven surface shown in FIG. 14(d) is made. After the underlying film 540a and the underlying film 540b are post-baked, a reflection layer 560 is formed by depositing a material with light reflectivity, such as aluminum, only on the uneven surfaces of the underlying films.

In the method disclosed in Publication No. 2003-75987, a series of processes ("application of a photosensitive resin, exposure to light, development, and post-baking") are performed twice to make the reflection layer 560. When the number of the processes is large like this, manufacturing takes a long time which increases manufacturing cost. In order to reduce the manufacturing period and cost, a method may be applied to eliminate the secondary series. In this case, the reflection layer 560 is formed on the substrate 500 and an underlying film 540a made in the first series. However, with only the first series, as shown in FIG. 14(c), since the bottom of concave portions of the underlying film 540a reaches the substrate, if the reflection layer is made as it is, the reflection layer reaching the bottom of the concave portions becomes flat, so that excellent scattering characteristics cannot be obtained. To prevent the reflection layer formed on the bottom of the concave portions from being flat, a method may be applied wherein the exposure is executed so that the bottoms of the concave portions do not reach the substrate. Specifically, in the exposure process, illumination of light is controlled so that the depth of the photosensitive material, through which light acts, is smaller than the film thickness of the photosensitive material. When development is performed after such exposure, the underlying film is made with concave portions that are shallower than the film thickness of the photosensitive resin. However, in such a manner, since the light acting on the photosensitive material does not act all the way to the bottom of the substrate, some photosensitive resin is left on a portion outside of the uneven surface, i.e., a portion outside of a panel display area. If the resin is left on a portion corresponding to a mounting region outside of the panel display area, a problem arises in that a data line made of a light-transmission conductive material, such as ITO (indium tin oxide), and provided in this region is broken.

The present invention has been made with such problems as a background, and it is an object of the invention to provide a manufacturing method of an electro-optical apparatus substrate, a manufacturing method of an electro-optical apparatus including the manufacturing method of the electro-optical apparatus substrate, the electro-optical apparatus substrate, the electro-optical apparatus using the electro-optical apparatus substrate, and an electronic instrument, which are capable of removing a photosensitive resin formed on an uneven portion to a depth smaller than the film thickness of the photosensitive resin while not leaving the photosensitive resin on portions other than the uneven portion.

SUMMARY

To solve the problems mentioned above, in a manufacturing method of an electro-optical apparatus substrate having an uneven light-reflection part according to the present invention, the method includes the steps of applying a positive photosensitive material on a substrate; exposing the photosensitive material with light for making unevenness so as to form a region corresponding to a convex portion of the light-reflection part so that the light acts until a depth smaller than that of a film thickness of the photosensitive material; exposing the outside of a region to be the electro-optical apparatus substrate with light for making the substrate so that the light acts until a depth larger than that of the film thickness of the photosensitive material applied in the applying process; developing the photosensitive material exposed to light so as to remove the region exposed during exposure; and forming a reflection layer with light reflectivity on an uneven surface formed on the photosensitive material in the developing process.

According to the manufacturing method of an electro-optical apparatus substrate, the depth of a concave portion of the uneven surface formed on the photosensitive material is smaller than the film thickness of the photosensitive material, and the photosensitive material in an area outside the region to be the electro-optical apparatus substrate is removed, so that side faces of the electro-optical apparatus substrate become flat. Since the depth of the concave portion of the uneven surface is less than the film thickness of the photosensitive material, the reflection layer formed on the bottom of the concave portion does not become flat, thereby achieving excellent scattering characteristics. Also, since the side faces of the electro-optical apparatus substrate become flat, a problem is solved in that an electrode arranged so as to overpass the side faces is not broken off.

According to the manufacturing method, in the exposing process for the substrate, in order to produce an opening for transmitting light within the region to be the electro-optical apparatus substrate, an area in the region to be the electro-optical apparatus substrate corresponding to the opening may also be exposed with light in addition to the outside of the region to be the electro-optical apparatus substrate.

In order to solve the problems mentioned above, in a manufacturing method of an electro-optical apparatus substrate having an uneven light-reflection part according to the present invention, the method includes the steps of applying a negative photosensitive material on a substrate; exposing the photosensitive material applied in the applying process with light for making unevenness so as to form a region corresponding to a convex portion of the light-reflection part so that the light acts until a depth smaller than that of a film thickness of the photosensitive material; exposing the substrate with light for forming a region to be the electro-optical apparatus substrate so that the light acts until a depth larger than that of the film thickness of the photosensitive material by excluding the light from the outside of the region to be the electro-optical apparatus substrate; developing the photosensitive material exposed to light and removing the region shielded during exposure; and forming a reflection layer with light reflectivity on an uneven surface formed on the photosensitive material in the developing process.

According to the manufacturing method of an electro-optical apparatus substrate, the depth of a concave portion of the uneven surface formed on the photosensitive material is smaller than the film thickness of the photosensitive material, and the photosensitive material in an area outside the region to be the electro-optical apparatus substrate is removed, so that side faces of the electro-optical apparatus substrate become flat. Since the depth of the concave portion of the uneven surface is less than the film thickness of the photosensitive material, the reflection layer formed on the bottom of the concave portion does not become flat, thereby achieving excellent scattering characteristics. Also, since the side faces of the electro-optical apparatus substrate become flat, a problem is solved in that an electrode arranged so as to overpass the side faces is not broken off.

According to the manufacturing method, in the exposing process for the substrate, in order to produce an opening for transmitting light within the region to be the electro-optical apparatus substrate, an area in the region to be the electro-optical apparatus substrate corresponding to the opening may also be excluded from light in addition to the outside of the region to be the electro-optical apparatus substrate.

Also, according to the manufacturing method, the exposing process for making the unevenness may be carried out with a stepper while the exposing process for the substrate may also be performed with the stepper or with a full plate exposure.

Also, the present invention provides a manufacturing method of an electro-optical apparatus including the manufacturing method of the electro-optical apparatus substrate. According to the manufacturing method of the electro-optical apparatus, since the depth of the concave portion of the uneven surface is less than the film thickness of the photosensitive material in the manufacturing process, the reflection layer formed on the bottom of the concave portion does not become flat, achieving excellent scattering characteristics. Also, since the side faces of the electro-optical apparatus substrate become flat, a problem is solved in that an electrode arranged so as to overpass the side faces is not broken off.

The present invention provides an electro-optical apparatus substrate including an underlying film having an uneven surface; and a light-reflection layer with light reflectivity, wherein the light-reflection layer is arranged on the uneven surface of the underlying film, side faces of the underlying film are flat, and the depth of a concave portion in the uneven surface of the underlying film is smaller than the film thickness of the underlying film. In such an electro-optical apparatus substrate, since the depth of the concave portion of the uneven surface is smaller than the film thickness of a photosensitive material, a reflection layer formed on the bottom of the concave portion does not become flat, so that excellent scattering characteristics can be achieved. Also, since side faces of the electro-optical apparatus substrate become flat, a problem is solved in that an electrode arranged so as to overpass the side faces is not broken off.

Preferably, the electro-optical apparatus substrate may include a light-exclusion layer made of a black resin material for shielding light, and the light-exclusion layer may be arranged on a predetermined region of the uneven surface of the underlying film.

Preferably, the electro-optical apparatus substrate may include a light-exclusion layer made of a metallic material for shielding light, and the light-exclusion layer may be arranged on a predetermined region of the uneven surface of the underlying film.

Also, preferably, the electro-optical apparatus substrate may include a light-exclusion layer formed by depositing a colored resin for shielding light, and the light-exclusion layer may be arranged on a predetermined region of the uneven surface of the underlying film.

Also, preferably, the electro-optical apparatus substrate may include the underlying film made of a positive photosensitive material.

Also, preferably, the electro-optical apparatus substrate may include the underlying film made of a negative photosensitive material.

Furthermore, the present invention provides an electro-optical apparatus including an electro-optical apparatus substrate and an electronic instrument including the electro-optical apparatus as a display. The side faces of the above-mentioned electro-optical apparatus substrate become flat in the manufacturing process, so that a problem is solved in that an electrode arranged so as to overpass the side faces is not broken off. Hence, yield is excellent and manufacturing cost is reduced, thereby reducing the manufacturing cost of the electro-optical apparatus including an electro-optical apparatus substrate and the electronic instrument including the electro-optical apparatus as a display.

BRIEF DESCRIPTION OF THE DRAWINGS

FIG. 12 includes plan views showing a large mask for a full plate exposure used in the modified manufacturing method.

DETAILED DESCRIPTION

Figure 1:
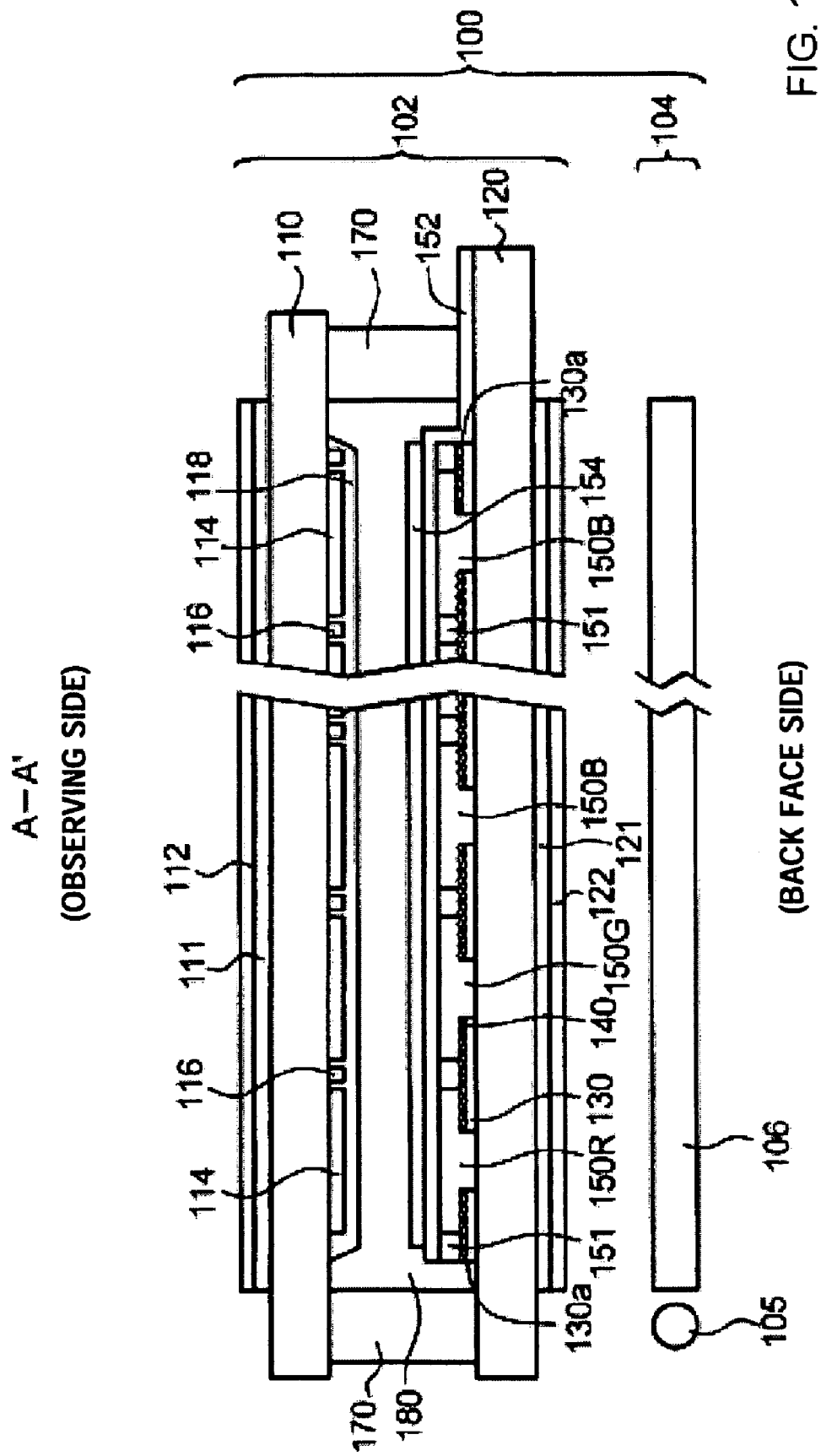
FIG. 1 is a sectional view of a liquid crystal device according to an embodiment of the present invention.

Embodiments according to the present invention will be described below with reference to the drawings. In the drawings below, the component elements, sizes and proportions are changed from the actual structure to easy viewing.

Structure of Liquid Crystal Device

Figure 2:
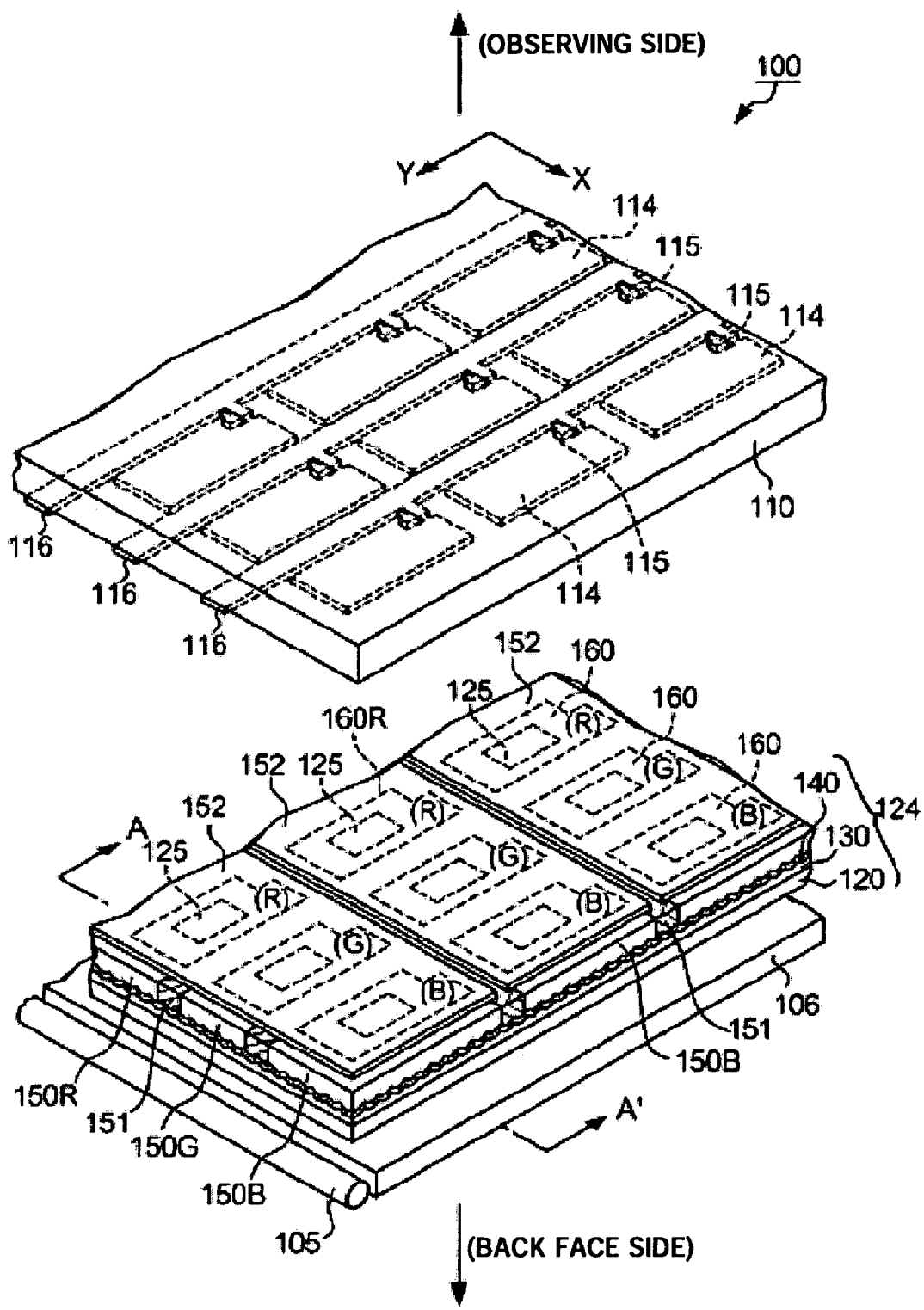
FIG. 2 is an exploded perspective view of the liquid crystal device.

First, a liquid crystal device 100 according to an embodiment of the present invention will be described. FIG. 1 is a sectional view of the liquid crystal device 100 according to the embodiment; and FIG. 2 is an exploded perspective view showing a schematic structure of the liquid crystal device 100, and FIG. 1 is equivalent to a sectional view at the line A–A' of FIG. 2. As shown in FIGS. 1 and 2, the liquid crystal device 100 includes a liquid crystal panel 102 having liquid crystal 180 (not shown in FIG. 2), which is a kind of an electro-optical substance, and clamped between a first substrate 110 and a second substrate 120, and a backlight unit 104 arranged in the liquid crystal panel 102 adjacent to the second substrate 120. In the description below, as shown in FIG. 1, the side of the liquid crystal 180 adjacent to the first substrate 110 denotes "an observing side" for convenience sake in the sense that an observer viewing display images is positioned thereat while the side of the liquid crystal 180 adjacent to the second substrate 120 denotes "a back face side".

The backlight unit 104 includes a light guide plate 106 and a light source 105 such as a cold-cathode ray tube. The light source 105 irradiates a side face of the light guide plate 106 which is a plate member with light. On a surface of the light guide plate 106 facing the liquid crystal panel 102, a diffusing plate (not shown) is bonded for uniformly diffusing light from the light guide plate 106 on the liquid crystal panel 102. On the opposite surface, a reflection plate (not shown) is bonded for reflecting light to be emitted toward the back face to the liquid crystal panel 102, so that incident light from the side face is uniformly led to the second substrate 120 of the liquid crystal panel 102.

The first substrate 110 of the liquid crystal panel 102 is an optically transparent plate member such as glass. On the observing-side surface of the first substrate 110, a retardation film 111 (not shown in FIG. 2) for improving contrast and a polarizer 112 (not shown in FIG. 2) for polarizing incident light are deposited in that order from the first substrate 110. On the surface of the first substrate 110 adjacent to the liquid crystal 180 (back face side), pixel electrodes 114, such as ITO (indium tin oxide) films, are arranged in a matrix pattern. In the clearances between the pixel electrodes 114, a plurality of scanning lines 116 extending in one direction (Y-direction shown in FIG. 2), and each pixel electrode 114 and the scanning line 116 adjacent thereto are connected together with a TFD (thin film diode) element 115 therebetween, which is a two-terminal switching element having non-linear current/voltage characteristics. As shown in FIG. 1, the surface of the first substrate 110 having the pixel electrodes 114, the scanning lines 116, and the TFD elements 115 formed thereon is covered with an alignment layer 118 (not shown in FIG. 2). The alignment layer 118 is an organic thin film of polyimide, for example, and rubbing treatment is applied on the alignment layer 118 for defining an alignment state of the liquid crystal 180 when a voltage is not applied.

The second substrate 120 is an optically transparent plate member such as glass. On the back face-side surface of the second substrate 120, a retardation film 121 (not shown in FIG. 2) and a polarizer 122 (not shown in FIG. 2) are deposited in that order from the second substrate in the same way as in the first substrate 110. On the other hand, on the surface of the second substrate 120 adjacent to the liquid crystal 180 (observing-side), an underlying film 130, a transflective layer 140, three-color color filters 150R, 150G, and 150B, data lines 152, and an alignment layer 154 (not shown in FIG. 2) are deposited in that order from the second substrate. Among them, the alignment layer 154 is an organic thin film like the alignment layer 118, and a rubbing treatment is applied thereon.

The underlying film 130 is shaped by exposing and developing a photosensitive material, and its side faces 130a are flat. The underlying film 130 is provided with light-transmission openings 125, each being located around the center of each dot 160, and a smooth uneven surface 130b (referred to as the uneven surface below) formed in the observing side.

Figure 3A:
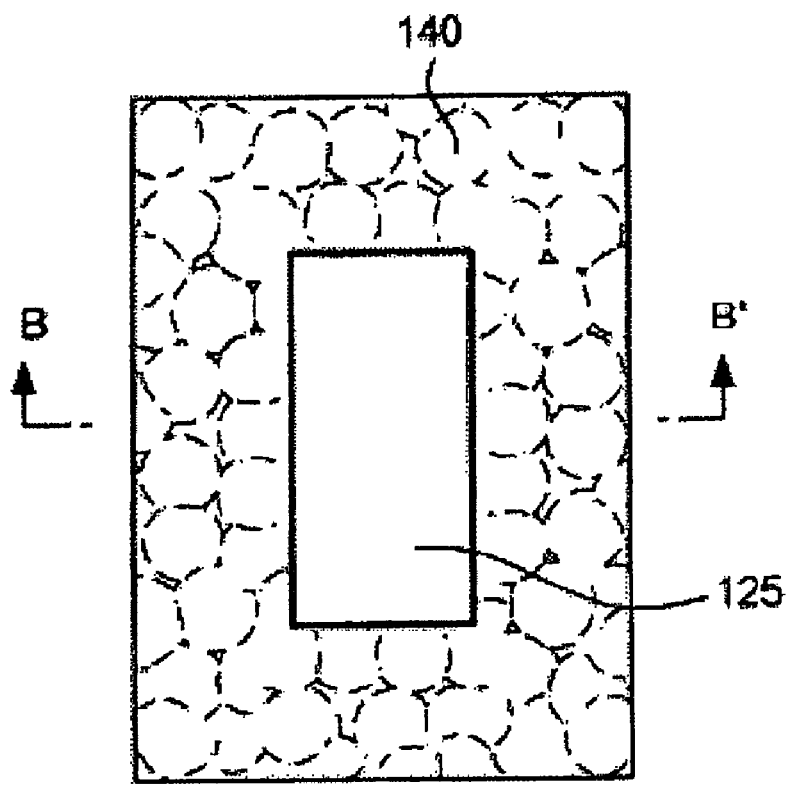
FIG. 3 is a drawing showing a plan and a section of an electro-optical apparatus substrate included in the liquid crystal device.
Figure 3B:
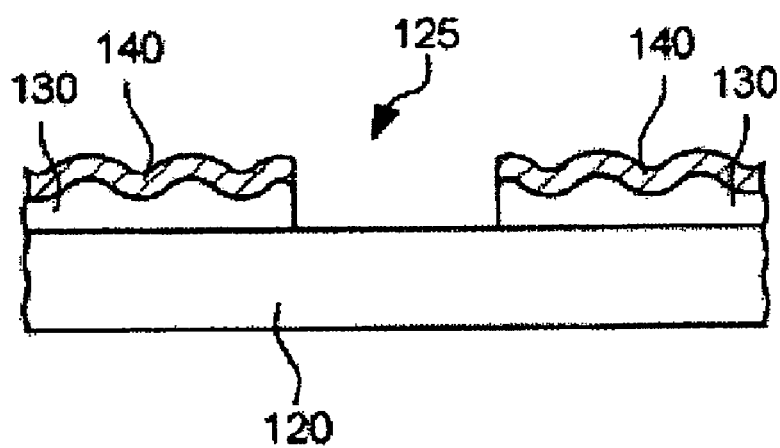

The transflector 140 is made by depositing a light-reflection material, such as aluminum or silver, on the observing-side surface of the underlying film 130 so as to have a thin film with a substantially predetermined thickness as shown in the plan view and the sectional view in FIG. 3. The surface shape reflects the uneven surface of the underlying film 130 (the surface with an uneven shape is referred to as "the diffusing reflection surface" below). For convenient description, a transflective functional substrate including the second substrate 120, the underlying film 130, and the transflector 140 is referred to as "the electro-optical apparatus substrate 124" below.

The color filters 150R, 150G, and 150B are resin layers provided corresponding to each of the dots 160. Each color filter is colored with pigment or the like with any color of red (R), green (G), and blue (B) so as to selectively transmit light with a wavelength corresponding to its color. Symbols (R), (G), and (B) in FIG. 2 indicate that any of the color filters 150R, 150G, and 150B is located in each dot 160.

Light-exclusion layers 151 made of a black resin material having carbon black dispersed therein or a metallic material, such as chrome (Cr), are arrayed in a lattice so as to bridge the clearances between the color filters 150R, 150G, and 150B so that the layers 151 shield side faces adjacent thereto of the color filters 150R, 150G, and 150B. The light-exclusion layer 151 is not limited to a specific material, and it can also be formed by overlapping two or three coloring layers of the color filters 150R, 150G, and 150B constituting the color layer, that is, by depositing these layers.

Each of a plurality of the data lines 152 is a band-shaped electrode made of a light-transmission conductive material, such as ITO. As shown in FIG. 2, the data lines 152 are formed on surfaces of the color filters 150R, 150G, and 150B extending in a direction (X-direction in FIG. 2) intersecting the above-mentioned scanning lines 116 so as to oppose a plurality of the pixel electrodes 114 aligned on the first substrate 110. The data line 152, as shown in FIG. 1, is positioned on the observing-side surface of the second substrate 120 so as to overpass side faces of the electro-optical apparatus substrate 124.

The first substrate 110 and the second substrate 120 structured as described above, as shown in FIG. 1, are bonded together with sealing compounds 170 therebetween. In a region surrounded by components on both the substrates and the sealing compounds 170, the TN (twisted nematic) liquid crystal 180, for example, is enclosed. In such a configuration, an orientation direction of the liquid crystal 180 clamped between the first substrate 110 and the second substrate 120 therebetween is changed by a voltage applied between the pixel electrodes 114 and the opposing data lines 152. As shown in FIG. 2, minimum units 160 of the regions, in which the orientation direction of the liquid crystal 180 changes corresponding to the applied voltage, are arranged in a matrix pattern, each functioning as a sub-pixel (dot). When external light enters the liquid crystal panel 102 from the observing side, the external light is diffused and reflected by the electro-optical apparatus substrate 124 toward the observing side so as to achieve a reflective display. On the other hand, when light from the backlight unit 104 is incident from the back face side of the liquid crystal panel 102, the incident light passes through the openings 125 of the underlying film 130 and the transflector 140 so as to be emitted toward the observing side, thereby achieving a transmissive display.

Manufacturing Method

Figure 4:
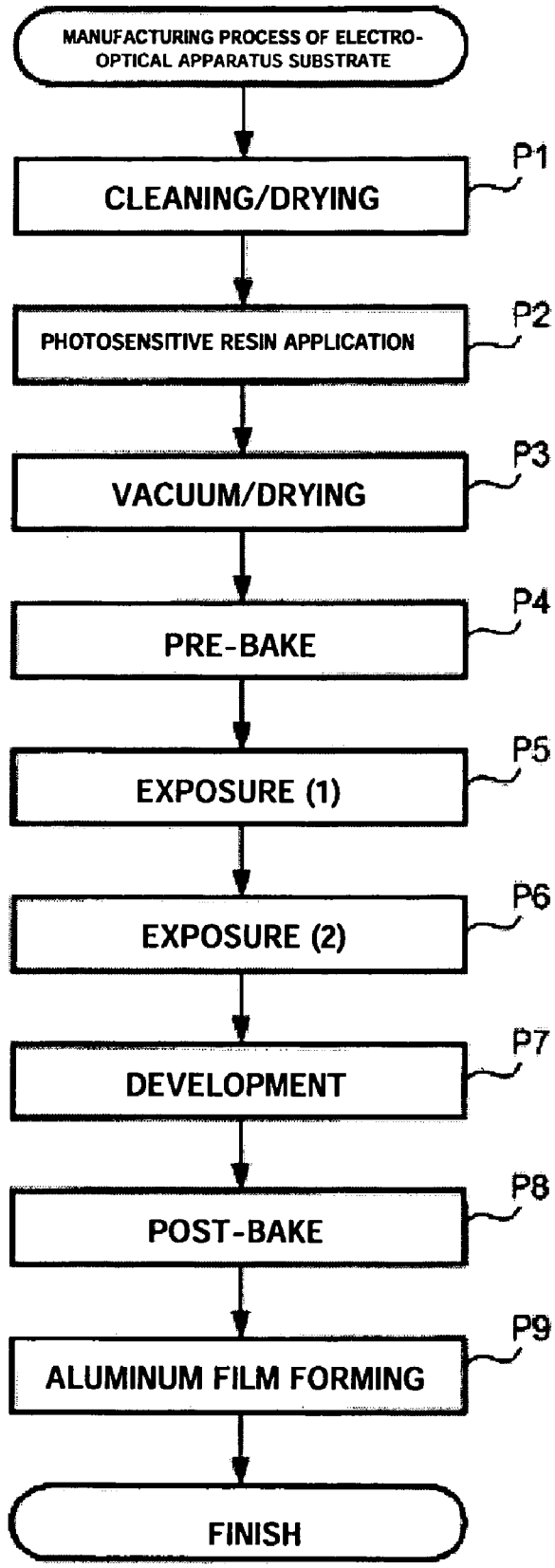
FIG. 4 is a flowchart showing a manufacturing method of the electro-optical apparatus substrate.
Figure 5:
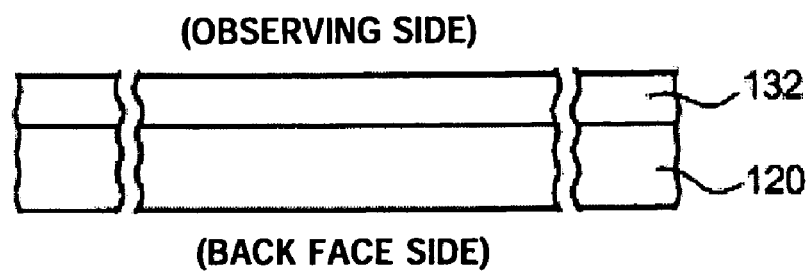
FIGS. 5(a)–(d) include drawings showing states of each process in the manufacturing method.
Figure 5:
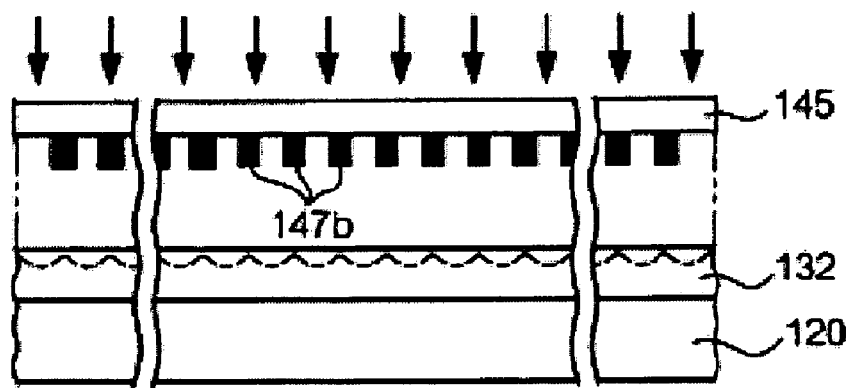
Figure 5:
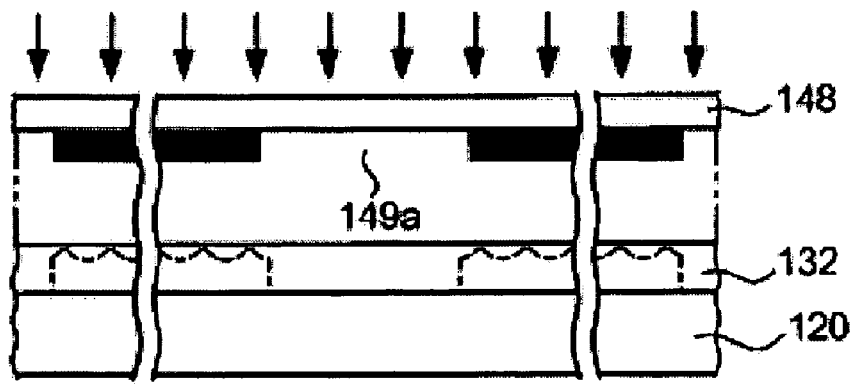
Figure 5:
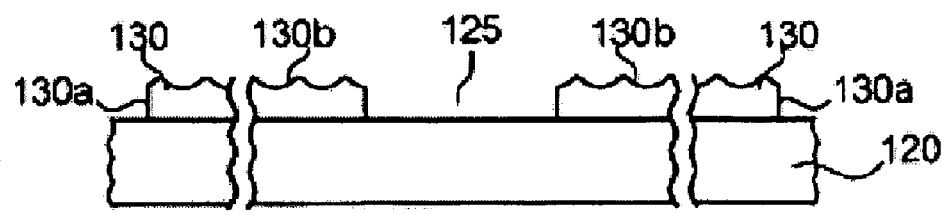
Figure 6:
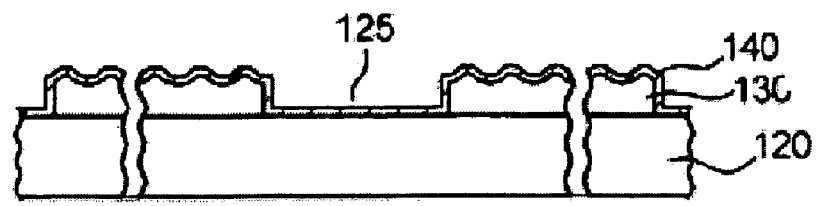
FIGS. 6(a)–(c) include drawings showing states of each process in the manufacturing method.
Figure 6:
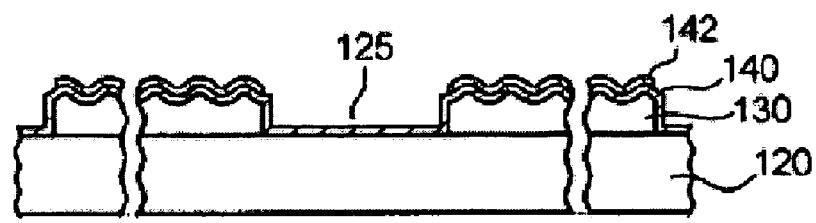
Figure 6:
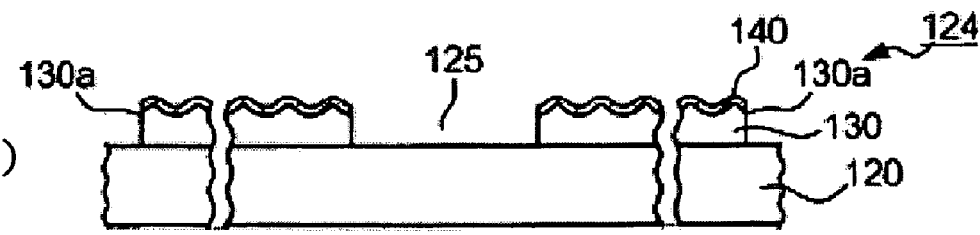

Next, a manufacturing method of the electro-optical apparatus substrate 124 according to the embodiment of the present invention will be described. FIG. 4 is a flowchart showing a manufacturing process of the electro-optical apparatus substrate 124; and FIGS. 5 and 6 are partial sectional views of the second substrate 120 in the manufacturing process. FIGS. 5 and 6 show a portion of the second substrate 120 corresponding to one dot 160 and a boundary portion of the second substrate 120 between an area outside of a panel display area and an area within the panel display area.

In this manufacturing process, first, the second substrate 120 is cleaned, and then dried (Process P1 in FIG. 4). Next, as shown in FIG. 5(a), the surface of the second substrate 120 to be the observing side is coated with a positive photosensitive resin 132, which is a kind of photosensitive materials, by a spin coat method, for example (Process P2 in FIG. 4). The photosensitive resin 132 may be PC405G (manufactured from JSR (Japanese Synthetic Rubber) Co. limited), for example. Then, the positive photosensitive resin 132 applied to the second substrate 120 is dried under a vacuum condition (Process P3 in FIG. 4); and the dried positive photosensitive resin 132 is pre-baked for about 120 s in a temperature range from about 85° C. to 105° C. (Process P4 in FIG. 4).

Figure 7A:
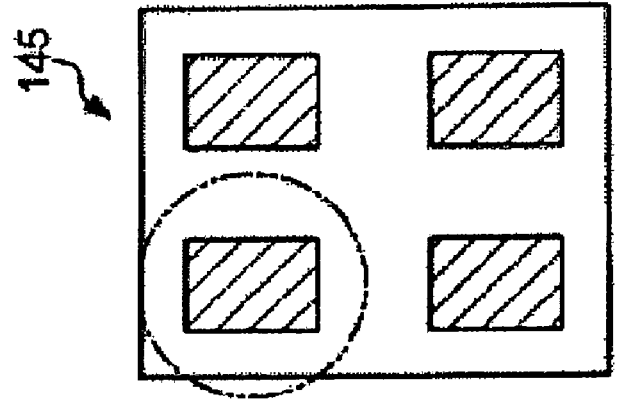
FIG. 7 includes plan views showing a reticle used in the manufacturing of the electro-optical apparatus substrate.
Figure 7B:
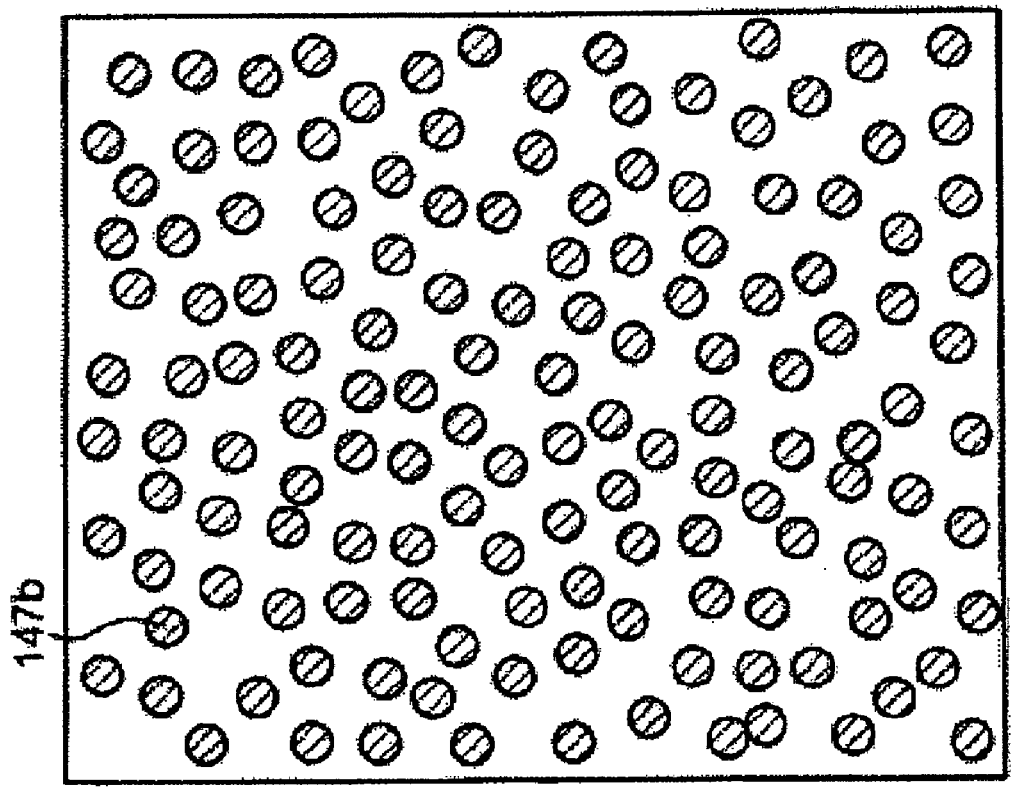

Then, the pre-baked positive photosensitive resin 132 is exposed using a reticle 145 patterned as shown in FIG. 7 with a stepper (Process P5 in FIG. 4). As shown in FIG. 7, the reticle 145 is made of a light-transmission substrate, such as glass, having light-exclusion layers (shown by oblique lines in the drawing), such as chrome, formed thereon. As shown in the enlarged view of FIG. 7, the reticle 145 is provided with a plurality of light shielding units 147b for unevenness, which are miniature shielding regions for forming the uneven surface 130b of the underlying film 130. Since the photosensitive resin 132 is positive, when it is radiated with light, the radiated portion is dissolved by developer in a developing process, which will be described later, and then it is removed.

Figure 8:
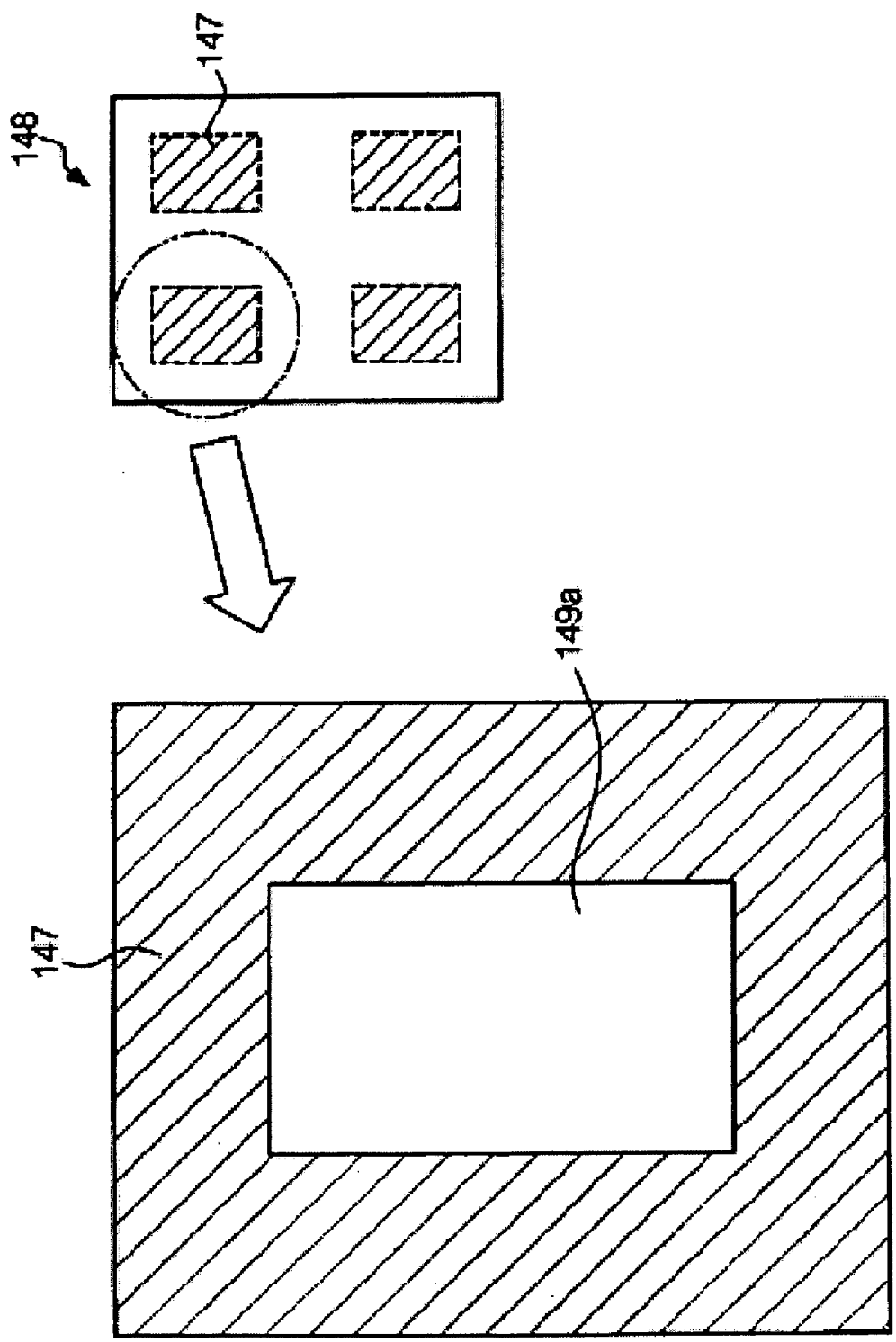
FIG. 8 includes plan views showing a reticle used in the manufacturing of the electro-optical apparatus substrate.

Using such a reticle 145, if the photosensitive resin 132 is exposed for 1,600 ms, for example, light transmitted through the reticle 145, as shown in FIG. 5(b), acts (is operative) through part of the upper surface of the photosensitive resin 132, indicated by a broken line in the drawing. Since the depth through which the light transmitted through the reticle 145 acts depends on the material of the photosensitive resin 132 and light intensity during exposure, the depth of the photosensitive resin 132 so treated can be changed by varying exposure time. After exposing the entire second substrate 120 by successively displacing the reticle 145 with the stepper so as to repeat the exposure, exposure is made using a reticle 148 (Process P6 in FIG. 4). FIG. 8 is a drawing showing the reticle 148 used in the second exposure. As shown in the drawing, the reticle 148 is made of a light-transmission substrate, such as glass, having light-exclusion layers 147 (shown by oblique lines in the drawing) formed thereon.

In the reticle 148, a portion corresponding to the panel display area is shielded, and the reticles 148 are arranged in the same matrix pattern corresponding to each dot 160 in the liquid crystal panel 102. As shown in the enlarged view of FIG. 8, the reticle 148 is provided with light-transmission sections 149a for making the openings 125 in each region corresponding to one dot 160. Using such a reticle 148, when second exposure is made for 4,000 ms, for example, different from the time of the first exposure, light passing through unshielded portions of the reticle 148, i.e., the light-transmission sections 149a and a portion corresponding to an out of the panel display area, acts all the way to the extreme bottom of the photosensitive resin 132. After exposing the entire substrate 120 by successively displacing such a reticle 148 with the stepper so as to repeat the exposure, the photosensitive resin 132 is developed (Process P7 in FIG. 4). Then, as shown in FIG. 5(d), the photosensitive resin disposed in the concave portions of the uneven surface, the openings 125, and portions out of the panel display area are removed to the depths through which the light acts in the exposure process so as to form the underlying film 130 with the flat side faces 130a and the uneven surface 130b.

After finishing the developing process of the photosensitive resin 132, the photosensitive resin 132 is successively irradiated with ultraviolet rays (referred to as UV below), such as i rays. The photosensitive resin 132 (PC405G) used in the embodiment has a tinge of yellow, and by the UV irradiation, the tinge of yellow is eliminated so as to improve the optical transparency. The purpose is for helping to solve the problem in that if the underlying film 130 is assumed to have color, the reflection light should reflect the color when external light is reflected in the electro-optical apparatus substrate 124. In addition, this is a specific process for the photosensitive resin 132 used according to the embodiment, and is not indispensable to the manufacturing process of the electro-optical apparatus substrate 124. Then, the photosensitive resin 132 is baked at a temperature of 220° C. for 50 min, for example (Process P8 in FIG. 4).

Then, as shown in FIG. 6(a), aluminum or an aluminum alloy is formed with a substantially predetermined thickness so as to cover the underlying film 130 as the transflective layer 140 by sputtering, for example (Process P9 in FIG. 4). According to the embodiment, since the concave portions of the uneven surface formed on the underlying film 130 do not extend to the second substrate, the concave portions of the uneven surface 130b do not become flat. Next, as shown in FIG. 6(b), in order to remove portions of the aluminum layer other than the uneven surface 130b, masks 142 are provided. Specifically, portions of the underlying film 130 corresponding to the uneven surface 130b are covered with the masks 142. Then, after portions of the aluminum layer not covered with the masks 142 are etched, when the masks 142 are removed, as shown in FIG. 6(c), the diffusing reflection electro-optical apparatus substrate 124 having the openings 125 and the uneven transflective layer 140 is manufactured.

Subsequently, a method for building components on the second substrate 120 having the transflective layer 140 formed thereon will be described with reference back to FIG. 1. After the transflective layer 140 is produced as described above, a thin film made of chrome, for example, is successively produced on the reflection-side (observing-side) surface of the second substrate 120 by sputtering, for example. Then, the thin film is patterned with a photolithography technique and an etching technique so as to obtain the lattice light-exclusion layer 151. The light-exclusion layer 151 is not limited to a specific material, and it can also be formed by overlapping two or three coloring layers of the color filters 150R, 150G, and 150B constituting the color layer, that is, by depositing these layers.

Each of the red, green and blue color filters 150R, 150G, and 150B is applied in a matrix pattern continuously on the transflective layer 140 of the second substrate 120. These color filters 150R, 150G, and 150B may be made of a photosensitive resin colored with pigments, for example. Then, a thin film made of ITO is produced so as to cover the color filters 150R, 150G, and 150B and the light-exclusion layer 151 for producing the data lines 152 by patterning the thin film. Since the side faces 130a in the electro-optical apparatus substrate 124, become flat by removing portions of the photosensitive resin corresponding to the out of the panel display area in the developing process, there is no problem with the breaking off of data lines arranged out of the panel display area so as to overpass the side faces 130a. Thus, the quality of the electro-optical apparatus substrate 124 is improved, resulting in a quality improvement of the liquid crystal device 100. Then, after the data lines are formed, the alignment layer 154 is produced so as to cover the data lines 152, and a rubbing treatment is applied on the surface of the alignment layer 154.

The manufacturing method of the components/produced on the second substrate 120 has been described. The second substrate 120 obtained with the manufacturing method and the first substrate 110 having the pixel electrodes 114, the scanning lines 116, the TFD elements 115, and the alignment layer 118 produced thereon are bonded together with the sealing compounds 170 therebetween in a state that the alignment layer 118 opposes the alignment layer 154. Then, the liquid crystal 180 is injected into a space surrounded by the substrate 110, the substrate 120, and the sealing compounds 170, and thereafter, the space containing the liquid crystal 180 injected therein is sealed with a sealant (not shown). Then, on the external surfaces of the first substrate 110 and the second substrate 120 integrated with each other, the retardation films 111 and 121 and the polarizers 112 and 122 are bonded so as to complete the liquid crystal panel.

As described above, according to the manufacturing method of the embodiment, since the concave portions of the uneven surface formed on the underlying film 130 do not reach the second substrate, the concave portions of the transflective layer 140 do not become flat. Hence, in the transflective layer 140, no mirror-reflective portion exists, so that excellent scattering characteristics can be achieved. Also, since the photosensitive resin in a portion out of the panel display area is removed so that the side faces 130a of the electro-optical apparatus substrate 124 become flat, the data lines 152 arranged so as to overpass the side faces 130a are not broken off.

Modifications

One embodiment of the present invention has been described. However, the present invention is not limited to the embodiment described above, and various modifications can be made. For example, the embodiment may be modified as follows.

Figure 9:
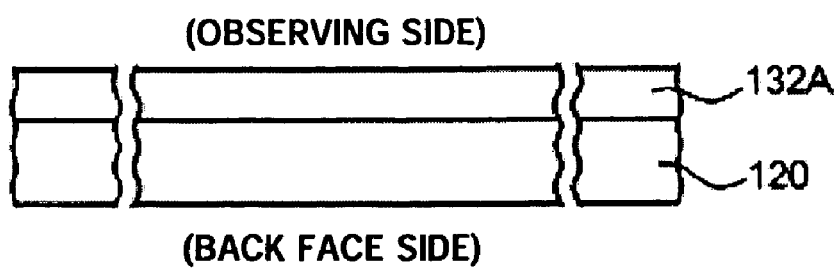
FIGS. 9(a)–(d) include drawings showing states of each process in a manufacturing method according to a modified embodiment.
Figure 9:
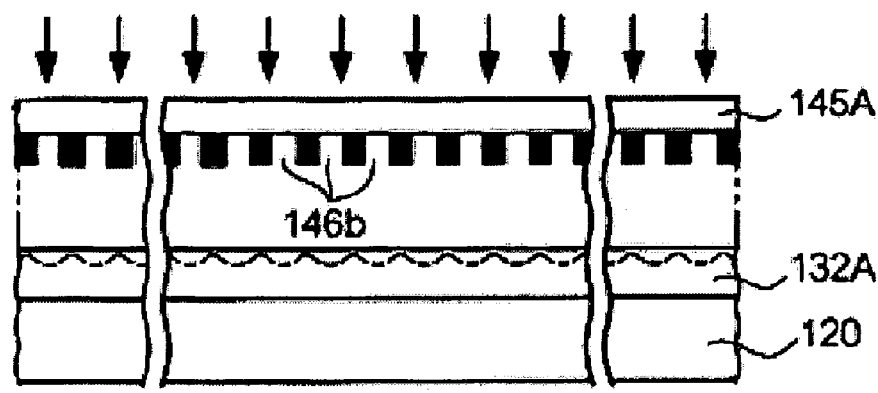
Figure 9:
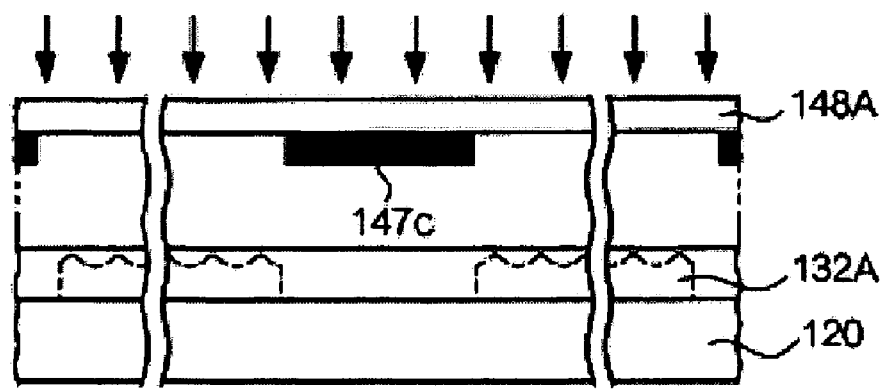
Figure 9:
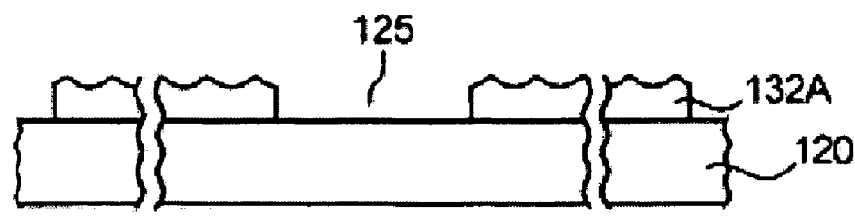
Figure 10A:
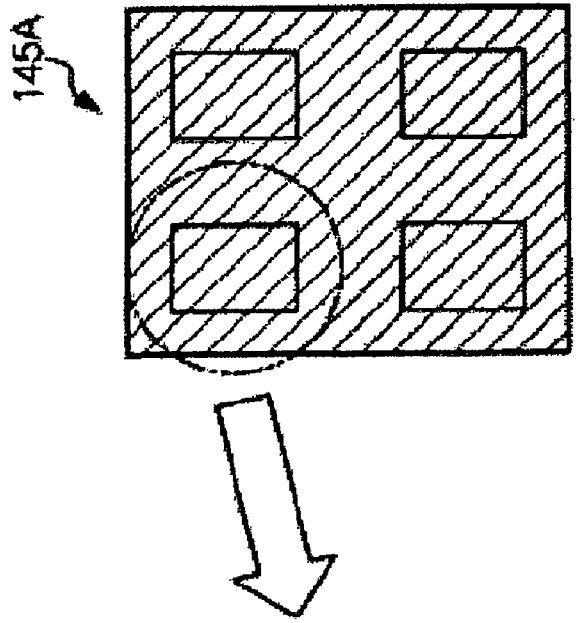
FIG. 10 includes plan views showing a reticle used in the modified manufacturing method.
Figure 10B:
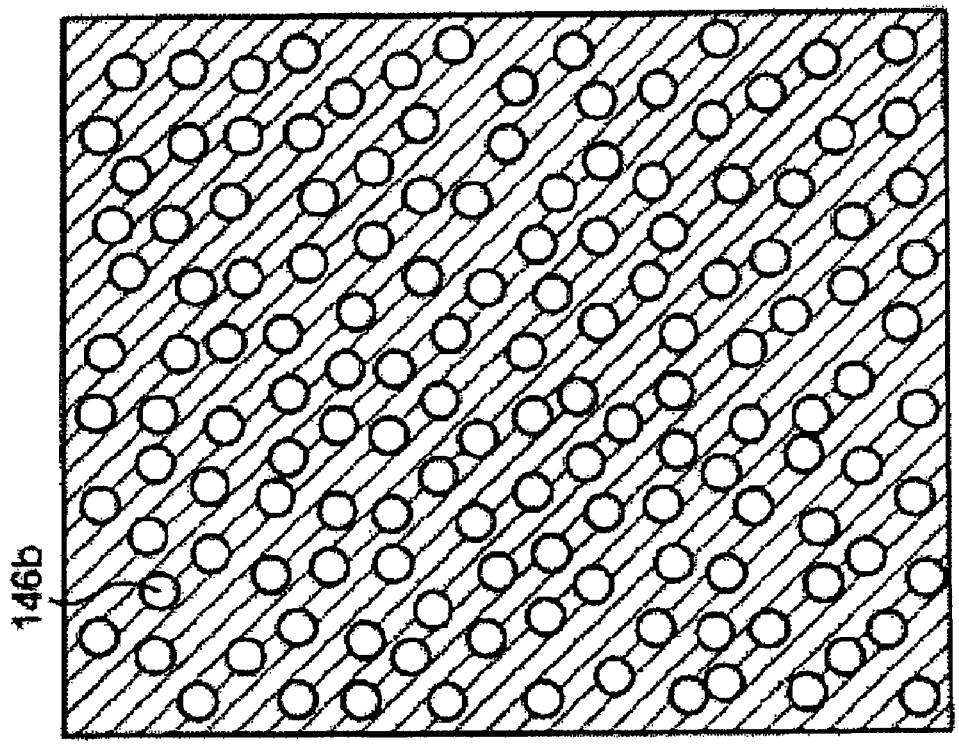

According to the embodiment, the electro-optical apparatus substrate 124 is manufactured using a positive photosensitive material, which becomes soluble by exposure to light; alternatively, a negative photosensitive material may be used, which becomes insoluble by exposure to light. FIG. 9 is a partial sectional view of the second substrate 120 in the manufacturing process of the electro-optical apparatus substrate when the negative photosensitive material is used. FIG. 9 shows a portion of the second substrate 120 corresponding to one dot 160 and a boundary portion between an out of a panel display area and a within the panel display area. First, the second substrate 120 shown in FIG. 9(a) having a negative photosensitive resin 132A, which is a kind of photosensitive material, applied thereon is exposed with light using a reticle 145A with a stepper, as shown in FIG. 9(b). FIG. 10 is a drawing showing a pattern of the reticle 145A used in the exposure. Since in the negative photosensitive resin, an exposed portion is left as a pattern, as shown in the enlarged view of FIG. 10, translucent portions 146b are provided for creating unevenness by leaving the convex portions of the uneven surface, i.e., to expose portions corresponding to the convex portions to light, while portions, from which the resin needs to be removed, are shielded. In the first exposure using the reticle 145A, as shown in FIG. 9(b), light transmitting portions not excluded from light acts to a surface indicated by a broken line in an upper surface of the photosensitive resin 132A.

Figure 11A:
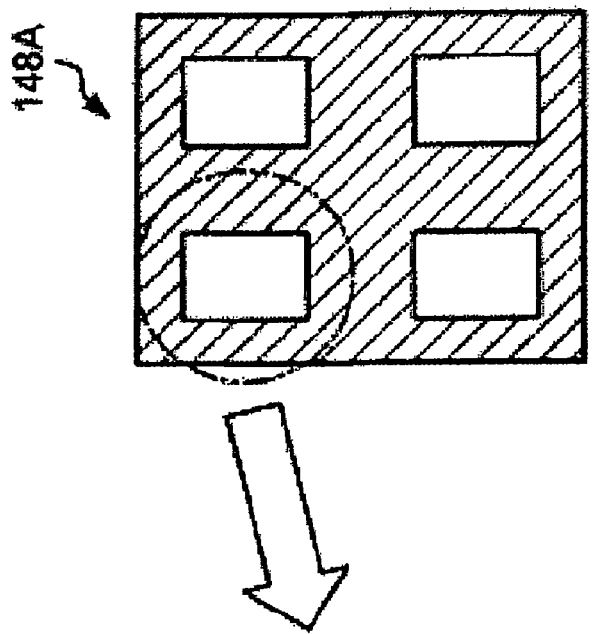
FIG. 11 includes plan views showing a reticle used in the modified manufacturing method.
Figure 11B:
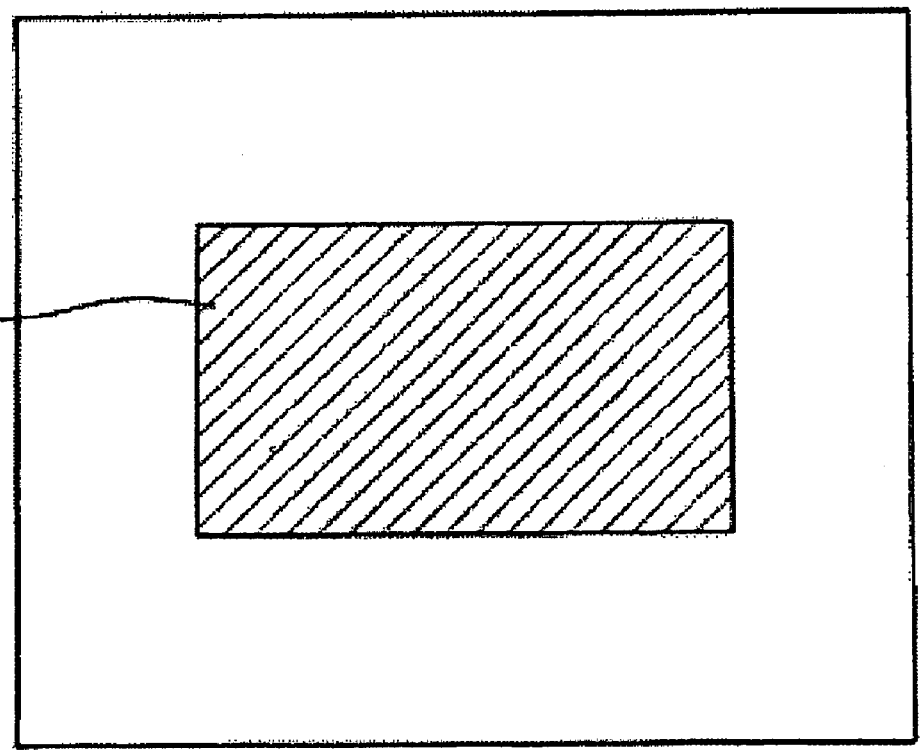

Then, the second exposure is carried out using a reticle 148A. FIG. 11 is a drawing showing a pattern of the reticle 148A used in the second exposure. As shown in the drawing, the reticle 148A is provided with light-exclusion layers 147c for removing the photosensitive resin on a portion out of the panel display area. When the second exposure is made using the reticle 148A for a time that is different from that of the first exposure, as shown in FIG. 9(c), portions corresponding to the openings and out of the panel display area are shielded and light acts on the uneven surface region. After the exposure using the reticle 145A and the reticle 148A described above, when the photosensitive resin 132A is developed, the photosensitive resin 132A with flat the side faces 130a and having the openings 125 and the uneven surface 130b (the underlying film 130) is made as shown in FIG. 9(d). Even in such a manner using the negative photosensitive resin, since the concave portions of the uneven surface formed on the underlying film 130 do not reach the second substrate, the concave portions of the transflective layer 140 do not become flat. Hence, in the transflective layer 140, no mirror-reflective portion exists, so that excellent scattering characteristics can be achieved.

Also, since the photosensitive resin in a portion outside of the panel display area is removed so that the side faces 130a of the electro-optical apparatus substrate 124 become flat, a problem is solved in that the data lines 152 arranged so as to overpass the side faces 130a are not broken off.

According to the embodiment described above, the depth through which light acts on the photosensitive material is controlled with an exposure time. Alternatively, the depth may be controlled by changing light intensity.

Also, according to the embodiment described above, the photosensitive material is exposed to light with the stepper in that the reticle 145 and the reticle 148 are sequentially displaced for exposing. Alternatively, a full plate exposure may be used in that by preparing a mask for forming the uneven surface 130b by covering the entire second substrate 120 and a mask for forming the openings 125 and a portion out of the panel display area by covering the entire second substrate 120, the entire second substrate 120 is exposed to light in the first exposure process and in the second exposure process, respectively using one mask each. Also, in the first exposure process, the substrate may be exposed with the stepper like in the above embodiment while in the second exposure process, as shown in FIG. 12, the substrate may be exposed with the full plate exposure in that the entire second substrate 120 is exposed with one large mask. In the case where the second exposure is carried out with the full plate exposure, after the completion of the first exposure, the second exposure may be performed at about 80 to 160 mJ for about 2,000 msec to 4,000 msec. Also, according to the embodiment, the uneven shape may be deformed to be smooth by a heat treatment performed after the developing process.

In the manufacturing method described above, the first exposure may be performed with the reticle 148 for 4,000 msec while the second exposure may be performed with the reticle 145 for 1,600 msec. Also, in the manufacturing method described above, the reticle 148 is provided with the light-transmission sections 149a. However, the reticle 148 may not be provided with the light-transmission sections 149a. In the substrate manufactured in such a way, the film thickness of the reflection layer may be a thickness through which light from the backlight unit 104 transmits.

Figure 13:
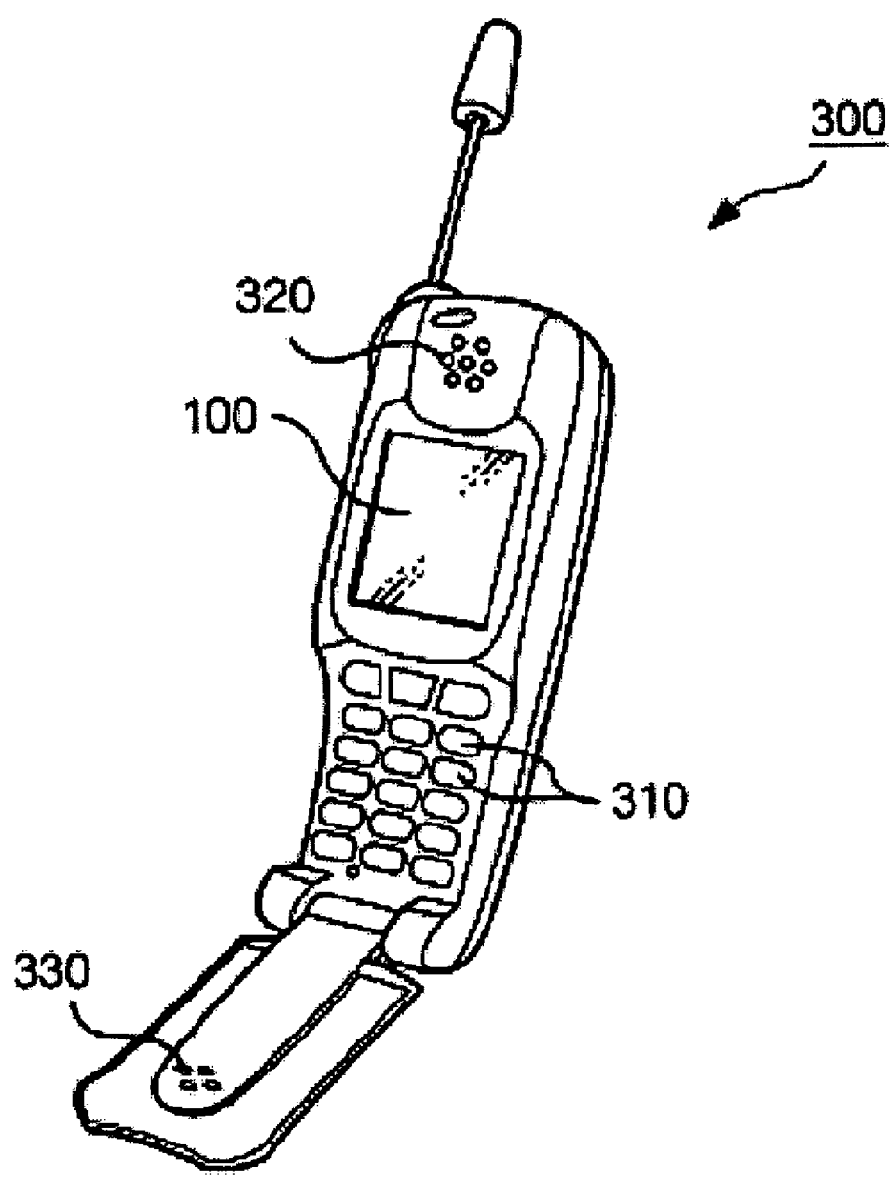
FIG. 13 is a drawing showing an example of an electronic instrument having the liquid crystal device mounted thereon.
Figure 14:
FIGS. 14(a)–(e) include drawings showing states of each process in a conventional manufacturing process of the electro-optical apparatus substrate.
Figure 14:
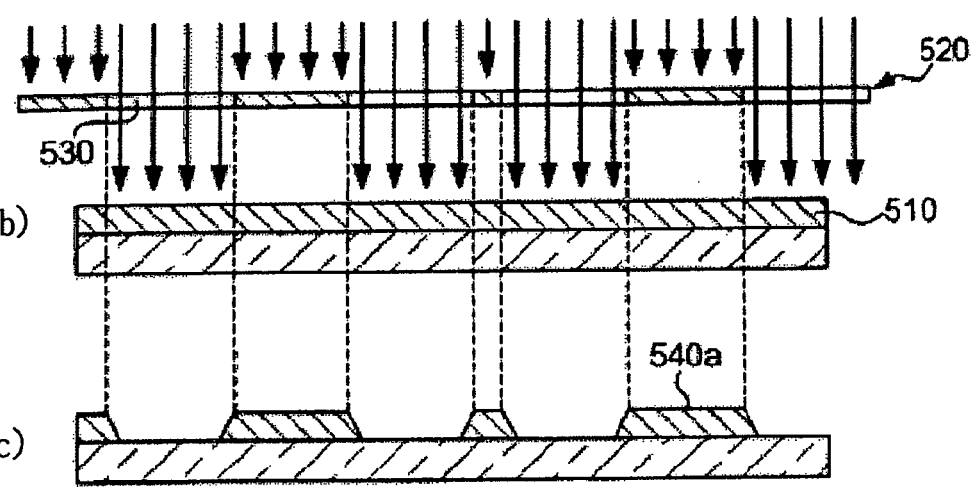
Figure 14:
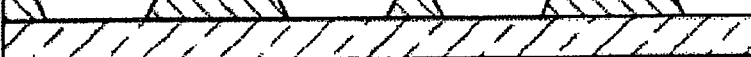
Figure 14:
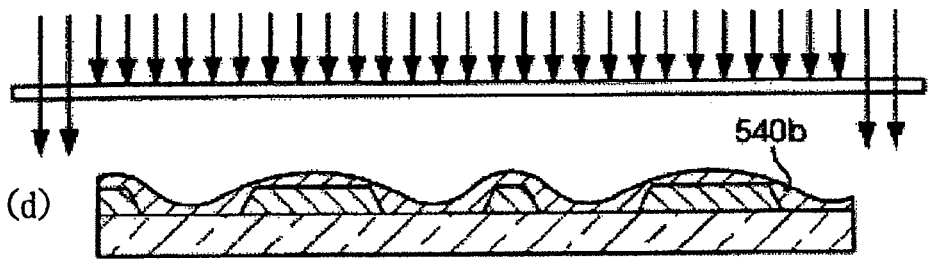
Figure 14:
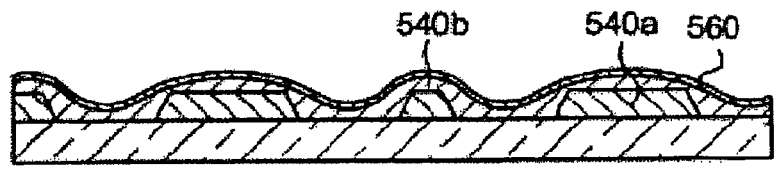

An electronic instrument having the liquid crystal device 100 described above mounted thereon will be described. FIG. 13 is an external view of a mobile phone 300 having the liquid crystal device 100 as a display. Referring to the drawing, the mobile phone 300 includes the liquid crystal device 100 as the display for displaying various kinds of information, such as telephone numbers, in addition to a plurality of operation buttons 310, an ear piece 320, and a mouth piece 330. Other than the mobile phone 300, the liquid crystal device 100 may be used for displays of various electronic instruments, such as computers, projectors, digital cameras, movie cameras, on-vehicle instruments, copying machines, and audio instruments.

What is claimed is:

1. A manufacturing method of an electro-optical apparatus substrate having a matrix of pixels each with an uneven light-reflection part, comprising:

applying a positive photosensitive material on a substrate;

a first exposing step of exposing the photosensitive material in a region corresponding to the matrix of pixels with light for making unevenness so as to form a region corresponding to convex portions of the light-reflection parts, the exposing being controlled so that the light acts to a depth that is smaller than a film thickness of the photosensitive material;

a second exposing step of exposing an outside region of the electro-optical apparatus substrate with light, the outside region being outside the region corresponding to the matrix of pixels, the exposing being controlled so that the light acts to a depth that is larger than the film thickness of the photosensitive material, without developing the photosensitive material between the first exposing step and the second exposing step;

developing the photosensitive material after the second exposing step to remove exposed photosensitive material; and forming a reflection layer on an uneven surface of the photosensitive material formed in the developing process.

2. The method according to claim 1, wherein in the second exposing step, an area corresponding to an opening for transmitting light within the region corresponding to the matrix of pixels is exposed with light in addition to the outside region.

3. The method according to claim 1, wherein the first exposing step for making the unevenness is carried out with a stepper while the second exposing step for the substrate is performed with a full plate exposure.

4. A manufacturing method of an electro-optical apparatus, comprising the manufacturing method of an electro-optical apparatus substrate according to claim 1.

* * * * *